United States Patent

Dropps

(10) Patent No.: US 9,305,901 B2
(45) Date of Patent: Apr. 5, 2016

(54) NON-CIRCULAR DIE PACKAGE INTERCONNECT

(71) Applicant: Seagate Technology LLC, Cupertino, CA (US)

(72) Inventor: Frank Dropps, Maple Grove, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/334,390

(22) Filed: Jul. 17, 2014

(65) Prior Publication Data

US 2016/0020192 A1 Jan. 21, 2016

(51) Int. Cl.
*H01L 23/50* (2006.01)
*H01L 25/00* (2006.01)
*H01L 25/065* (2006.01)
*H01L 23/538* (2006.01)
*H01L 23/532* (2006.01)
*H01L 21/768* (2006.01)

(52) U.S. Cl.
CPC .......... *H01L 25/0657* (2013.01); *H01L 21/768* (2013.01); *H01L 23/5328* (2013.01); *H01L 23/5386* (2013.01); *H01L 25/50* (2013.01); H01L 2224/49174 (2013.01); H01L 2225/06551 (2013.01); H01L 2225/06555 (2013.01)

(58) Field of Classification Search
CPC ................. H01L 25/0567; H01L 2225/06555; H01L 2224/49174; H01L 25/0657
See application file for complete search history.

(56) References Cited

U.S. PATENT DOCUMENTS

| 4,783,695 | A | | 11/1988 | Eichelberger et al. |
|---|---|---|---|---|
| 5,481,133 | A | * | 1/1996 | Hsu ........................... G11C 5/02 257/621 |
| 6,531,784 | B1 | * | 3/2003 | Shim et al. ..................... 257/777 |
| 6,650,019 | B2 | * | 11/2003 | Glenn et al. ................... 257/777 |
| 7,023,023 | B2 | | 4/2006 | Karnik et al. |
| 7,531,890 | B2 | * | 5/2009 | Kim .................. H01L 21/76898 257/621 |
| 7,588,964 | B2 | * | 9/2009 | Kwon ................. H01L 21/6835 257/686 |
| 7,598,523 | B2 | * | 10/2009 | Luo .......................... H01L 22/34 257/48 |
| 7,663,232 | B2 | * | 2/2010 | Kinsley ................... H01L 24/72 257/723 |
| 7,834,440 | B2 | * | 11/2010 | Ito ............................. G11C 5/02 257/685 |
| 8,110,910 | B2 | * | 2/2012 | Kim ...................... H01L 21/561 257/686 |
| 8,129,833 | B2 | * | 3/2012 | Kang ................. H01L 21/76898 257/211 |
| 8,278,756 | B2 | | 10/2012 | Wu et al. |
| 8,378,383 | B2 | | 2/2013 | Pagaila et al. |
| 8,916,875 | B2 | * | 12/2014 | Lee ................................. 257/48 |
| 2008/0036064 | A1 | * | 2/2008 | Han ....................... H01L 23/427 257/686 |
| 2008/0157332 | A1 | * | 7/2008 | Jo et al. ......................... 257/686 |
| 2008/0303131 | A1 | * | 12/2008 | McElrea ................. H01L 24/24 257/686 |
| 2009/0166840 | A1 | * | 7/2009 | Kang ................ H01L 21/76898 257/686 |
| 2010/0224990 | A1 | * | 9/2010 | Suh ................... H01L 21/76898 257/712 |
| 2010/0276801 | A1 | * | 11/2010 | Hoshino ............. H01L 21/6835 257/737 |
| 2011/0110062 | A1 | * | 5/2011 | Park et al. ...................... 361/783 |
| 2011/0250721 | A1 | | 10/2011 | Bowles et al. |
| 2011/0316117 | A1 | | 12/2011 | Kripesh et al. |
| 2012/0038045 | A1 | * | 2/2012 | Lee ....................... H01L 23/3107 257/738 |
| 2012/0108010 | A1 | * | 5/2012 | Tian et al. ..................... 438/109 |

(Continued)

*Primary Examiner* — Ida M Soward
(74) *Attorney, Agent, or Firm* — Hall Estill Attorneys at Law

(57) ABSTRACT

A computing component may consist of a die package that has at least a board, first computing layer, and second computing layer. Dielectric layers can separate each of the board, first computing layer, and second computing layer. The first computing layer may be disposed between the board and second computing layer. One or more interconnects can continuously extend from the second computing layer to the board with a non-circular cross-section shape.

16 Claims, 3 Drawing Sheets

(56) References Cited

U.S. PATENT DOCUMENTS

| | | |
|---|---|---|
| 2012/0196403 A1 | 8/2012 | Wu |
| 2012/0211875 A1 | 8/2012 | Usami |
| 2013/0020720 A1* | 1/2013 | Kim et al. .................... 257/774 |
| 2013/0032942 A1* | 2/2013 | Sasaki et al. ................. 257/738 |
| 2013/0037929 A1 | 2/2013 | Essig et al. |
| 2013/0099378 A1* | 4/2013 | Cho et al. ..................... 257/737 |
| 2013/0277821 A1* | 10/2013 | Lundberg ............... H01L 23/34 257/713 |
| 2014/0367844 A1* | 12/2014 | Hooper et al. ................ 257/712 |
| 2015/0014860 A1* | 1/2015 | Jang et al. .................... 257/774 |

* cited by examiner

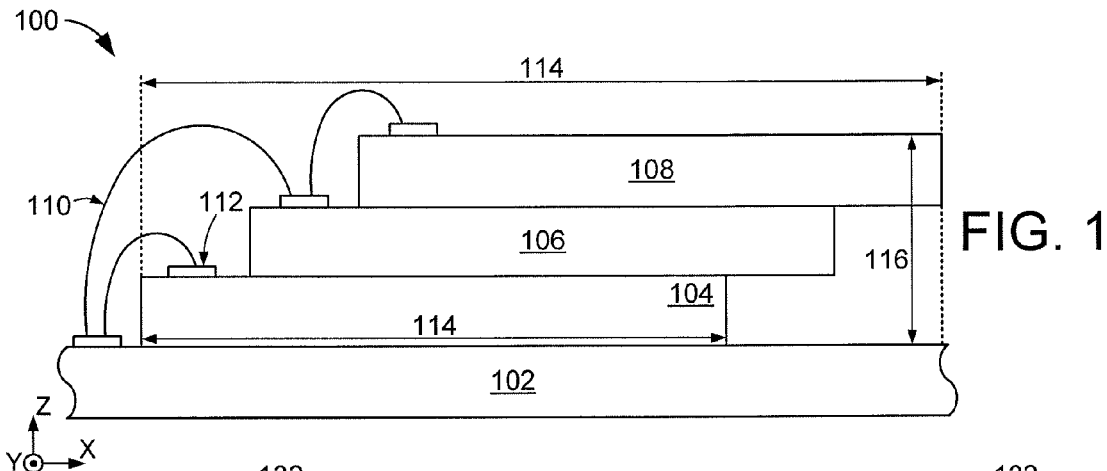
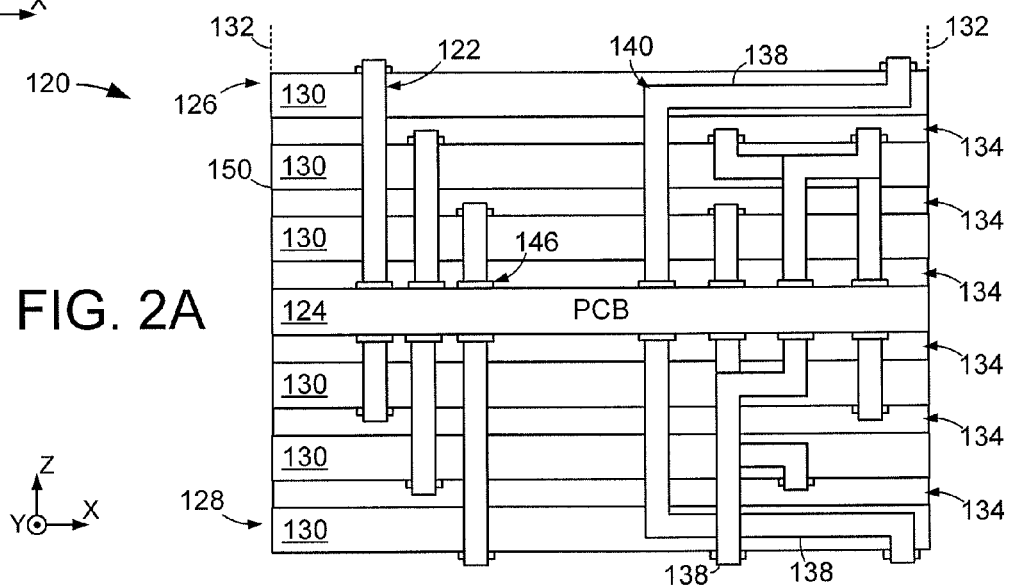
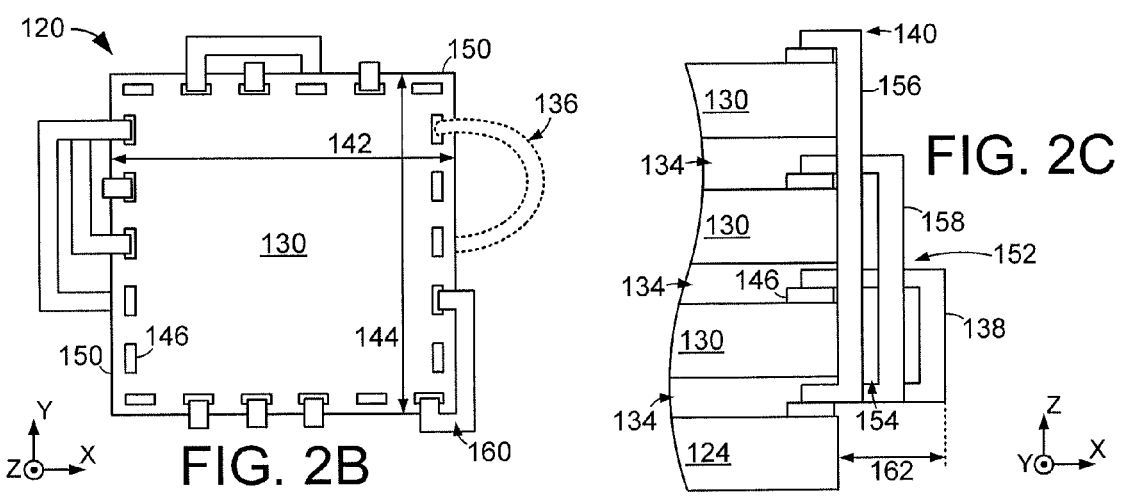

NON-CIRCULAR DIE PACKAGE INTERCONNECT

SUMMARY

In accordance with various embodiments, a die package may be configured with at least a board, first computing layer, and second computing layer. Dielectric layers can separate each of the board, first computing layer, and second computing layer. The first computing layer may be disposed between the board and second computing layer. One or more interconnects can continuously extend from the second computing layer to the board with a non-circular cross-section shape.

BRIEF DESCRIPTION OF THE DRAWINGS

FIG. 1 shows a cross-section block representation of a portion of an example die package configured in accordance with some embodiments.

FIGS. 2A, 2B, and 2C respectively display various views and portions of an example die package arranged in accordance with some embodiments.

DETAILED DESCRIPTION

Figure 3:
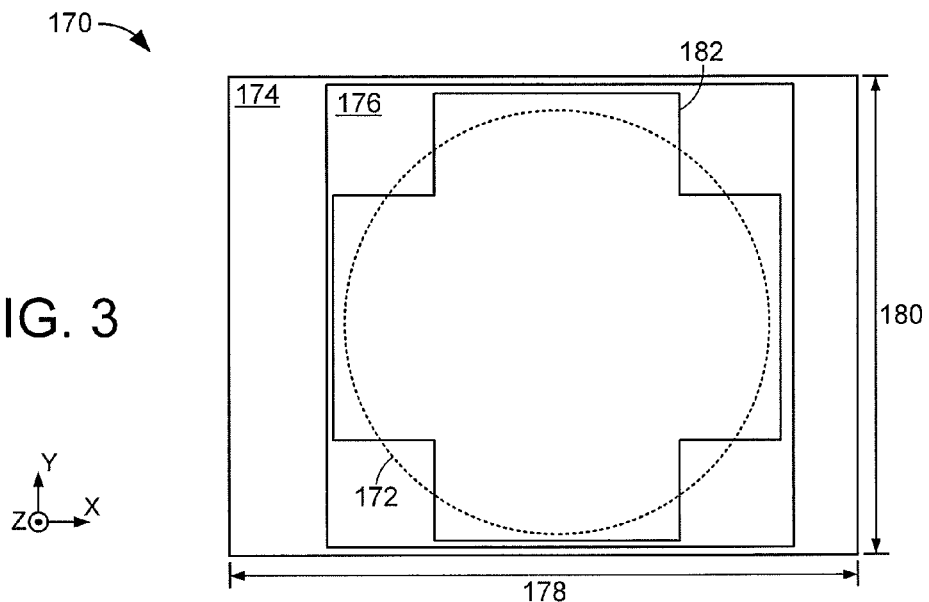
FIG. 3 provides a cross-section block representation of a portion of an example interconnect constructed and operated in accordance with some embodiments.

Over the past years and decades, computing devices have become physically smaller in yet more electronically robust. Continued reduction in size along with increased computing capabilities has emphasized the physical proximity of computing components, such as data storage devices and processing chips. Although computing components can be arranged in contacting configurations, the interconnection of multiple computing components can pose difficulties. For example, the use of circular shaped wire to interconnect computing components in close physical proximity may result in unwanted electrical shorts, thermal translation, and current transmission that inhibit large numbers of die from being incorporated into a die package. Additionally, the fabrication of numerous intricate and electrically separated interconnects in a die package can be time consuming and inefficient as circular shaped wire can sag, move, correspond with large clearance distances, and break inadvertently.

These issues have rendered various embodiments of a die package that has at least a board, first die layer, and second die layer each separated by dielectric layers. The first die layer may be disposed between the board and second die layer while at least one interconnect continuously extends from the second die layer to the board with a non-circular cross-section shape. The ability to print an interconnect with a non-circular cross-section allows the die package to be physically smaller due to the die layers being vertically aligned and the interconnect extending along an outer edge of the board and die layers. In contrast, connecting aspects of a die package with circular shaped wire interconnects can correspond with less die layer density due to the wires occupying much more space to ensure electrical isolation and reliable fabrication.

FIG. 1 illustrates a side view block representation of a portion of an example die package 100 that can be utilized in a computing, memory, or storage system in accordance with some embodiments. The die package 100 has a printed circuit board (PCB) 102 onto which first 104, second 106, and third 108 die layers are stacked. It is noted that the die layers 104, 106, and 108 can be any variety of similar and dissimilar components, such as, but not limited to, microchips, processors, data storage chips, sensors, and application specific integrated circuits (ASIC). The die layers 104, 106, and 108 are physically touching, which may increase computing density in the die package 100. However, the interconnection of numerous die layers corresponds is accommodated by staggering the layers to allow circular shaped wires 110 to contact and connect bond pads 112 of the PCB 102 with the various die layers 104, 106, and 108.

It can be appreciated that the number of die layers 104, 106, and 108 that can be incorporated into the die package 100 can be inhibited by the length of wire interconnect extending from the PCB 102. That is, a longer wire interconnect may be increasingly prone to failures and the length of the wire interconnect can provide a maximum number of die layers that can be incorporated into the die package 100. As shown, the staggered die layer configuration occupies a width 114 and height 116 that is greater than if the die layers 104, 106, and 108 were vertically stacked and aligned along the Z axis to form a stacked width 118. The increased staggered die package dimensions are utilized to allow the circular shaped wires 110 to have ample space to be accurately fabricated and reliably operated.

In other words, the circular shaped wires 110 can deform during fabrication and operation, such as during elevated device temperatures, which can produce electrical shorts and incomplete electrical pathways that jeopardize the integrity of the die package 100 as well as the device utilizing the die package 100. Hence, the staggered die layer configuration occupies more room than a vertically stacked configuration, but provides ample space for the circular wires to reliably be manufactured and operate.

FIGS. 2A, 2B, and 2C respectively display assorted views of an example die package 120 configured in accordance with various embodiments to utilize a non-circular shaped interconnect 122 to increase die density without compromising the operating integrity of the die package 120. As shown in FIG. 2A, the die package 120 has a central PCB 124 vertically disposed between first 126 and second 128 die stacks along the Z axis. The vertical alignment of multiple different edges of the die layers 130 of the first 126 and second 128 die stacks along common vertical planes 132 defines the vertical stack configuration of the die package 120, which contrasts the staggered die layer die package 100 shown in FIG. 1.

FIG. 2A further shows how dielectric adhesive layers 134 separate the respective die layers 130 as well as the respective die stacks 126 and 128 from the PCB 124. The dielectric material 134 can be one or more layers of similar or dissimilar materials, such as separate but contacting dielectric and adhesive layers, which electrically isolate the respective die layers 130 while securely positioning the die layers 130 in a vertically stacked configuration. The vertically stacked die package 120 configuration would not be conducive to circular wire interconnections between the PCB 124 and the die layers 130. In other words, if circular wire interconnects were implemented into the vertically stacked configuration shown in FIG. 2A, as illustrated by segmented wire 136, the die package 120 would have increased wire exposure to mechanical stresses, such as sagging and impact, which can jeopardize die package performance and inhibit package size scaling.

The increased size and exposure of the circular wire interconnect 136 can be mitigated by the use of at least one printed interconnect 138 that has a non-circular cross-section. Various embodiments utilize screen printing and 3D printing fabrication techniques to construct the printed interconnects 138 with linear boundaries that allow the printed interconnect 138 to be positioned in close proximity to the respective die stacks 126 and 128. The ability to configure the printed interconnects 138 on the common plane 132 of the die package 120 allows the die package 120 to be more densely constructed compared to the staggered die layer configuration shown in FIG. 1.

The linear dimensions and printed construction of the printed interconnects 138 allows for right angle interconnect routing 140 that provides the ability to position the printed interconnects 138 with increasing density while maintaining electrical separation. The printed construction of the printed interconnects can further allow electrically conductive materials to be employed that are flexible in response to thermal and mechanical stresses. In some embodiments, a conductive polymer interconnect material may contain metal particles, such as copper, aluminum, silver, and gold, with a predetermined concentration to promote efficient electrical transmission.

As illustrated by region 142, the right angle interconnect routing 140 capability of the printed interconnects 138 allows the interconnects 138 to overlap along the X plane while maintaining electrical isolation by disposing dielectric material between the overlapping interconnects 138. It is contemplated that the printed interconnects 138 are not limited to right angle routing 140 configurations and can be fabricated in any number of shapes, such as diagonal lines and curved lines, with non-circular cross-section shapes.

It is noted that the number of printed interconnects 138, die layers 130, and PCBs 124 is not limited to the configuration shown in FIG. 2A. As such, interconnects of different types, sizes, shapes, and materials can be utilized just as die layers having different functions and capabilities, such as data storage and processing. For example, the die package 120 can have one or more die layers 130 comprising at least one flash data storage chip and one or more die layer 130 comprising a processor, such as a microprocessor chip. The combination of processing and data storage capabilities within a single die package 120 can provide robust computing power that is complemented by the increased die layer 130 density provided by the vertically stacked die configuration allowed by the printed interconnects 138.

In comparison to the staggered die layer die configuration shown in FIG. 1, the vertically aligned die package 120 allows less horizontal space, along the X axis, in a device to be occupied. It is noted that wire interconnects with circular cross-sections can be utilized with the vertical die layer 130 configuration, as shown by wire 136, but such interconnect shape can be detrimental to both die package performance and reliability. That is, using a circular cross-section wire interconnect is not conducive to precise changes in interconnect routing, which increases the space occupied by the interconnect and the length of the interconnect to the detriment of die package 120 performance.

With the printed interconnects 138 that can be configured with a common cross-section area with right angle interconnect turns, less space can be occupied by the interconnect 138 and precise interconnect routing can allow increasing numbers of interconnects 138 and die layers 130 to be incorporated into the die package 120. The ability to secure the printed interconnect 138 to the outer edge of the die package 120 with adhesive allows the second die stack 128 to be positioned on the bottom side of the PCB 124, along the Z axis, without concern for gravity increasing stress on the interconnects 138. For example, the use of wire interconnects with circular cross-sections in an inverted orientation, like the second die stack 128, would place additional stress on the wire interconnects due to the wire interconnects being loose and pulled downward by gravity.

It is noted that circular cross-section wire interconnects can be secured by dielectric and adhesive materials. However, the increased length of the wire interconnect compared to the printed interconnect 138, which may be due to the ability of the printed interconnect 138 to make right angles with common cross-sectional areas, corresponds with the wire interconnect having delayed electrical response and performance along with increased risk of failures. Accordingly, the ability to create right angle printed interconnect 138 turns allows a die package 120 to be configured with one or more interconnect lengths along the X-Z plane that can optimize electrical response and performance of the die package 120.

A top view block representation of the die package 120 is displayed in FIG. 2B and illustrates how a die layer 130 can have an areal extent defined by X 142 and Y 144 dimensions and a shape, such as, but not limited to, rectangular, square, circular, and rhomboid shapes. The top view of FIG. 2B shows how the printed interconnects 138 can continuously extend from a die layer bond pad 146 with a rectangular cross-section and a right turn 148 that routes the interconnect 138 towards the PCB 124. The ability to route the printed interconnect 138 with the right angle turn allows the interconnect 138 to contact the outer edge 150 and add minimal areal extent in addition to the die layer 130.

In some embodiments, the printed interconnects 138 can overlap in the Y-Z axis while being physically separated and electrically isolated, as shown by region 152. Such overlap can be facilitated by positing dielectric material in a separation gap 154 between the interconnects 138. The dielectric material can be applied subsequent to the formation of a first printed interconnect 156 and before the formation of a second printed interconnect 158. The dielectric material may be integrated into dielectric material 134 that separates the die layers 130 in the X-Y plane.

Although not required or limiting, one or more material removal techniques, such as etching, can remove selected portions of the dielectric material 134 to expose the die layer bond pad 146. The patterned removal of the dielectric material 132 allows the unused bond pads 146 to be protected from inadvertent electrical shorts by the dielectric material 132. The patterned dielectric material 134 also provides a patterned substrate onto which the printed interconnects 138 can be formed. It is contemplated that dielectric material patterning and printed interconnect 138 formation may occur on any outer edge 150 of the die layer 130. In the example shown in FIG. 2B, three of the four outer edges 150 of the die layer 130 have been patterned and have at least one printed interconnect 138.

It is further contemplated that a printed interconnect 138 can continuously extend around a corner 160 of the die layer 130 to concurrently occupy multiple different outer edges 150 of the die layer 130. Another non-limiting embodiment can form a dielectric material between the interconnect layers via printing in a manner similar to the printing deposition utilized to construct the interconnects. Such dielectric printing allows the dielectric material to be etched and patterning steps to be skipped as the dielectric material is printed without excess extending into unwanted regions.

Various embodiments deposit one or more dielectric material 134 layers to continuously extend beyond the areal extent of the die layer 130 while other embodiments deposit dielectric material onto the outer edge 150 of the die layer 130 to tune the distance 162 which the printed interconnect 138 extends beyond the X 144 and/or Y 146 dimensions of the die layer 130. That is, the dielectric material 134 can correspond with a printed interconnect 138 distance 162 from the outer edge 150 of the die layer 130 that allows interconnect overlap and optimized interconnect length along the Z axis.

FIG. 2C conveys a side view block representation of a portion of the die package 120 that illustrates how the printed interconnects 138 can be tuned to provide increased interconnect density and reduced die package 120 size in accordance with assorted embodiments. Although increasing the extent of the die package 120 in the X-Y plane with overlapping printed interconnects 138 can decrease the die density of a system that incorporates the die package 120, the heightened number of interconnections and die layer density allowed by overlapping printed interconnects 138 can outweigh the increased X-Y plane die package 120 extent.

As shown in FIG. 2C, the ability to configure the printed interconnects 138 with right angle routing 140 allows for a plurality of interconnect overlaps and multiple interconnect nesting. Such printed interconnect 138 configurations can further allow the die layers 130 to be more densely packed along the Z axis while having multiple interconnects constructed in complex arrangements with robust electrical isolation and minimal increase in die package size.

In contrast, wire interconnects with circular cross-sections would have greatly increased risk of electrical shorts and interconnection failures if placed in the overlapping and nested interconnect configurations shown in FIG. 2C. The precise printed interconnect 138 configuration allowed by non-circular interconnect cross-section allows increased numbers of die layers 150 to be incorporated into the die package 120 without concern for interconnect failures corresponding to reduced interconnect spacing.

FIG. 3 is a cross-sectional view block representation of an example printed interconnect 170 configured in accordance with various embodiments. For comparison, segmented line 172 illustrates an interconnect with a circular cross-section, which cannot maintain a common cross-sectional area throughout a turn greater than a predetermined threshold, such as 45°. A rectangular interconnect cross-section, as shown by interconnect 174, can be utilized in some die packages and allow greater cross-sectional areas than interconnect 176 that has a square cross-sectional shape.

It is understood that the cross-sectional area of an interconnect can be tuned so that a square cross-section shape has a greater area than a rectangular cross-section shape. However, various embodiments configure interconnects with a common width 178 and varying heights 180 to allow increased interconnect density contacting an outer edge of a die stack. Through assorted, non-limiting embodiments, one or more interconnects can be configured to continuously extend from a die layer with multiple different cross-section shapes. For example, a printed interconnect may have a rectangular cross-section shape for a portion of its length and a square cross-section shape for another portion of its length, which can allow for increased interconnect density, particularly in nested and overlapping interconnect configurations.

It is contemplated that symmetrical and asymmetrical interconnect cross-section shapes can be utilized at will. Interconnect 182 corresponds with an example symmetrical cross-section shape that is non-circular and can allow a common cross-sectional area throughout a right angle turn. An asymmetrical interconnect shape, such as an acute triangle, can also be utilized at will. The ability to tune the size and cross-section shape of a printed interconnect allows increased interconnect density while maintaining electrical isolation of the interconnects, which optimizes a die package's size-to-performance balance.

Figure 4:
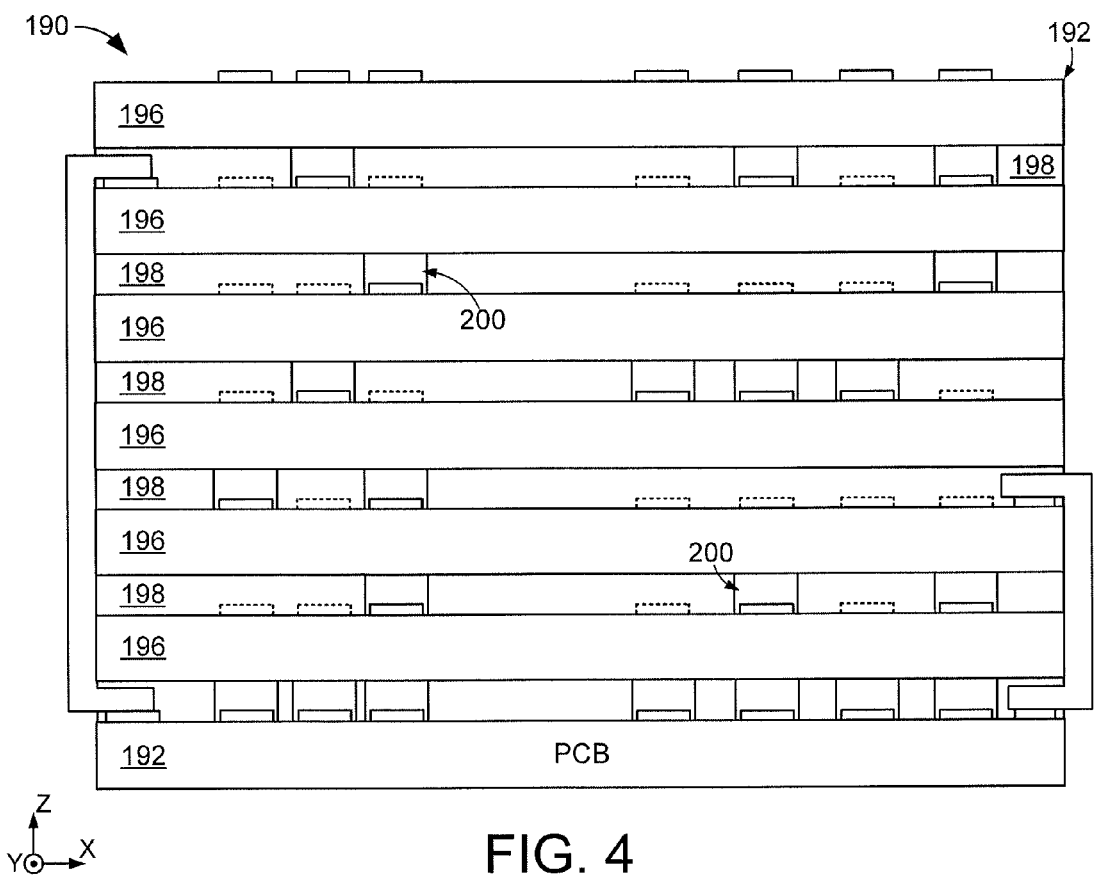
FIG. 4 illustrates a side view block representation of a portion of an example die package configured in accordance with some embodiments.

FIG. 4 displays a side view block representation of a portion of an example die package 190 configured in accordance with some embodiments during fabrication of the die package 190 before interconnects are printed on the shown die package edge. It is noted that a single die stack 192 is shown vertically stacked onto a PCB 194, but additional die stacks and PCBs can be employed without limitation. It is to be understood that the die stack 192 has a number of similar or dissimilar die layers 196 assembled and incorporated with the PCB 194 with dielectric adhesive material 198 that provides electrical isolation and positional securement of the assorted components.

The various dielectric adhesive materials 198 can be concurrently, simultaneously, and successively patterned to reveal selected portions of the various die layers 196 and PCB 194, such as one or more bond pads. Such patterning can remove the dielectric material 198 to provide individual interconnect apertures 200. Some embodiments print at least one non-circular cross-section interconnect directly into and between a pair of apertures 200 with a predetermined pathway, as illustrated in FIG. 2A. The printing of interconnects can concurrently construct a plurality of non-circular cross-section interconnects that respectively span between different pairs of apertures 200.

In the event printed interconnects are to be nested and/or overlap, one or more printed interconnects can be fabricated in contact with the outer edge of the die layers 196 before a dielectric material layer electrically isolates those interconnects from subsequently fabricated printed interconnects. The application of the dielectric material can correspond with the plugging or patterning around open interconnect apertures 200. Regardless of whether an interconnect aperture 200 is unplugged or remains open after the dielectric material is deposited, one or more interconnects can subsequently be printed to span at least one pair of the apertures 200. It is understood that the successive application of dielectric material and printing of an interconnect can be employed any number of times to provide numerous overlapping interconnects positioned along several different X-Z planes.

Through the tuning of the size, position, and status of the various interconnect apertures, complex printed interconnect pathways can be achieved without compromising electrical isolation. Additionally, the ability to overlap printed interconnects allows higher interconnect density and greater numbers of die layer connections to be made, which allows higher numbers of die layers to be integrated into the die package 190. In contrast to wire interconnects with circular cross-sections that can be mechanically and thermally liable during die package fabrication and operation, non-circular cross-section printed interconnects can be attached and secured to the die stack throughout the interconnect's length, which optimizes interconnect and die layer density as well as die package performance capabilities.

Figure 5:
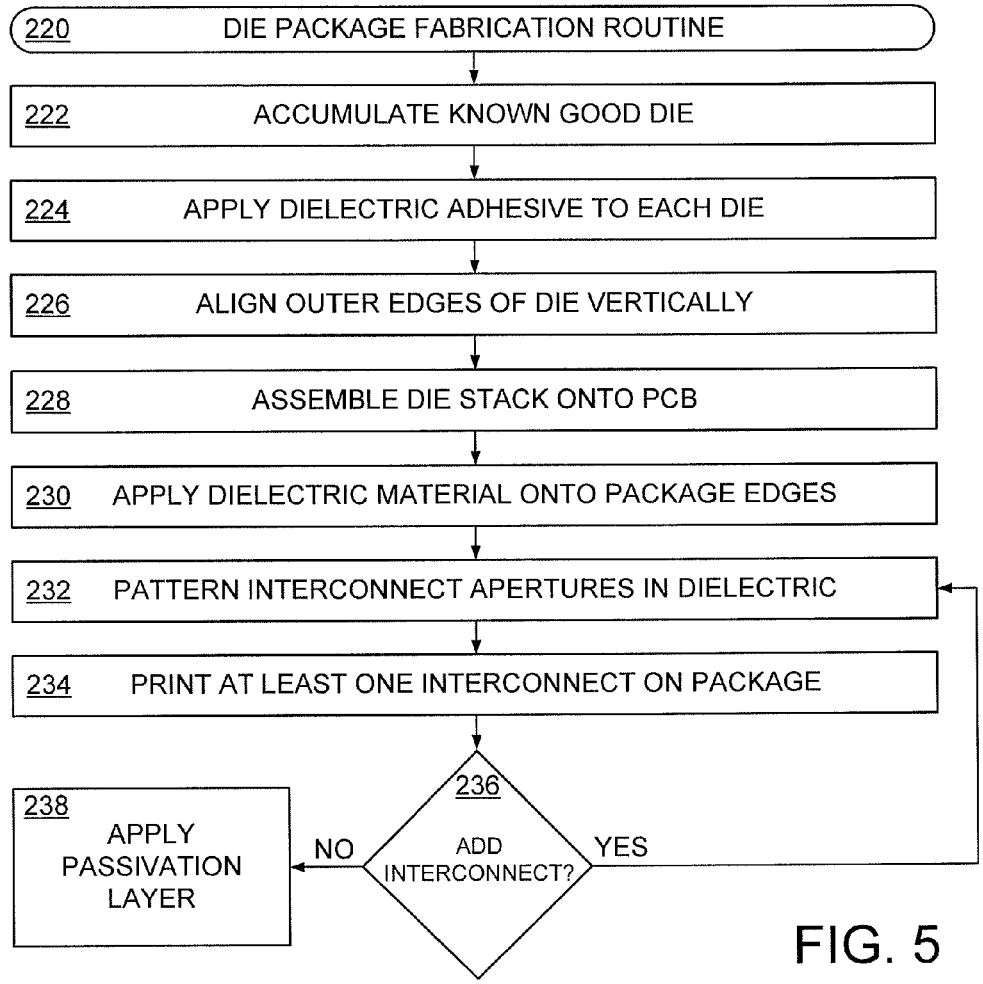
FIG. 5 is a flowchart of an example data storage medium fabrication routine that may be conducted in accordance with various embodiments.

FIG. 5 is a flowchart of an example die package fabrication routine 220 that may be carried out in accordance with various embodiments. The routine 220 may begin by accumulating known good die in step 222. The accumulation of known good die can involve processing, fabricating, organizing, and testing of die packages to certify a predetermined number of known good die are present. It is noted that the known good die can by similar and dissimilar types of die layers, such as processing, sensors, and data storage chips.

The known good die are assembled into a die stack by applying a dielectric adhesive material to each known good die in step 224 before the die layers are vertically stacked with aligned outer edges in step 226. In some embodiments, steps 222, 224, and 226 may be successively revisited to assemble one or more additional die stacks. Regardless of the number of die stacks, step 228 positions and secures each die stack onto a printed circuit board. One or more dielectric material layers can be deposited onto at least one die stack in step 230 to partially or completely encapsulate the bond pads present on the respective die layers and PCB.

With bond pads being partially or completely covered with dielectric material, step 232 next patterns interconnect apertures in the dielectric material to expose at least two bond pads. The exposed bond pads can then be electrically and physically connected by an interconnect printed in step 234. It is contemplated that step 234 can print one or more interconnects by depositing consecutive layers of electrically conductive material, such as copper, gold, and polymers containing conductive materials, to form a non-circular cross section. The material of the printed interconnect can be tuned to accommodate the position of the interconnect in a die package and within an array of interconnect, which can correspond with varying electrical and thermal loads.

Although a single interconnect, or layer of separate interconnects, can be created via steps 232 and 234, decision 236 evaluates if additional interconnects are to be fabricated. If additional interconnects are to be printed, step 232 is revisited and portions of dielectric material are removed to expose bond pads that are spanned via one or more interconnects printed in step 234. It is noted that the printing of additional interconnects can correspond with the deposition of additional dielectric material that electrically isolates existing interconnects from one another and from interconnects printed later.

When decision 236 determines that no additional interconnects are to be printed, routine 220 proceeds to step 238 where one or more passivation layers are applied onto some, or all, of the die package. Routine 230 is not limited to the steps and decisions shown in FIG. 5. As such, the various aspects of routine 220 are not required and can be modified, moved, and removed while additional steps and decisions can be added, without limitation. For example, at least one additional dielectric material layer may be deposited onto one or more exterior surfaces of the die stacks, PCB, and interconnects to serve as a thermal conductor as well as physical and electrical protector.

Figure 6:
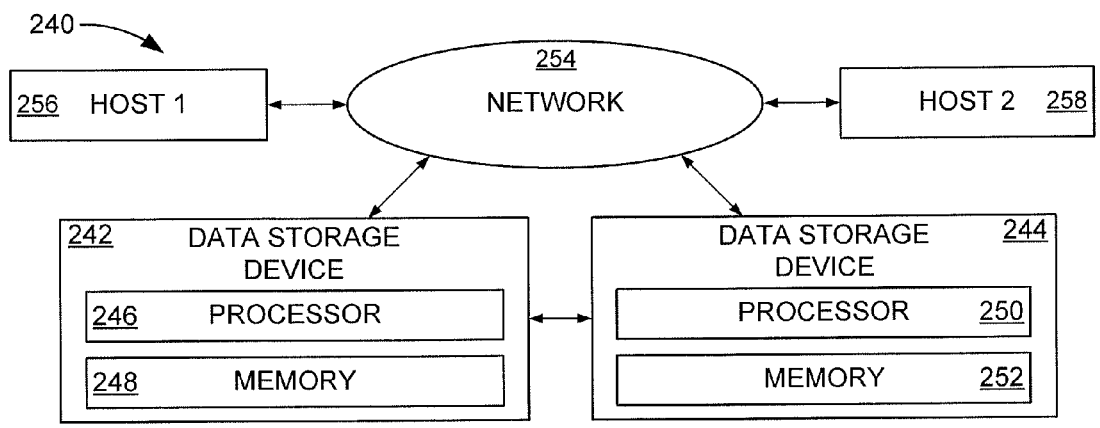
FIG. 6 is a block representation of an example computing system in which various embodiments may be practiced.

It is contemplated that a non-circular interconnect may be employed by a diverse variety of data storage systems, such as solid-state memory arrays, rotating data storage assemblies, and data processors. However, various embodiments utilize a tuned interconnect and die package in the example computing system 100 shown as a block representation in FIG. 6. The computing system 240 can consist of one or more local computing devices 242 and 244 that are similarly or dissimilarly configured. For example, the first computing device 242 may be configured as a smartphone, tablet computer, camera, or laptop computer with a local processor 246 and memory 248 while the second computing device 244 may be configured as a data storage device, such as a server, with a local processor 250 and memory 252.

Regardless of the type, computing power, capabilities, and number of computing devices 242 and 244 present in the computing system 240, the computing devices 242 and 244 can be locally and remotely connected via one or more wired and wireless networks 254. That is, the computing devices 242 and 244 may comprise a local network individually and collectively with one or more remote hosts 256 and 258. Various embodiments may configure the remote hosts 256 and 258 to be similar or dissimilar devices, such as nodes, servers, and other computing devices, that have selective access and control of the local computing devices 242 and 244 to provide passive and active data and computer processing management.

The ability to utilize one or more local and remote hosts and devices allows a computing device 242 and 244 to outsource data processing and storage. Such outsourcing can allow a computing device 242 and 244 to have reduced computing power, data storage capacity, and physical size, which is conducive to industry and consumer demand for physically smaller devices with high data storage and processing capabilities. Although outsourcing of computing capabilities can allow the local computing devices 242 and 244 to be physically smaller, the density of computing components in a device can inhibit the scale to which a computing device can be physically reduced.

Through the tuned design, fabrication, and operation of a die package employing printed interconnects having non-circular cross-section shapes, the die package can have a smaller physical size, increased number of die layers, and more complex interconnect arrangements. The ability to print multiple interconnects concurrently with right angle turns and consistent cross-sectional areas provides increased interconnect density and allows redundant die layers to be added to the die package to increase the die package performance and appropriate yield.

Printing interconnects concurrently also reduces production costs compared to wire interconnects that are attached individually. The ability to position interconnects on multiple sides of a die package with increased density and complexity, such as overlapping and nested interconnects, allows die stacks to be attached to opposite sides of PCB without concern for gravity increasing the risk of interconnect failure. The increased interconnect density provided by printed, non-circular cross-section shape, interconnects contrasts wire interconnects that are afforded relatively large space that increases the size of the die package without mitigating the interconnect's vulnerability to mechanical and thermal stresses causing interconnect failures.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising:
   a die package comprising a board, first die layer, and second die layer each separated by a dielectric layer, the first die layer disposed between the board and second die layer; and
   an interconnect comprising a conductive polymer and continuously extending from the second die layer to the board with a non-circular cross-section shape.

2. The apparatus of claim 1, in which the first and second die layers comprise a first die stack positioned on a first side of the board, a second die stack comprising at least third and fourth die layers comprise a second die stack, the second die stack positioned on a second side of the board, opposite the first side.

3. The apparatus of claim 1, in which the first and second die layers vertically aligned with at least two outer edges aligned along different planes, the different planes each perpendicular to the board.

4. The apparatus of claim 1, in which the interconnect comprises a flexible material.

5. The apparatus of claim 1, in which the conductive polymer comprises metal particles.

6. The apparatus of claim 1, in which the first and second die layers are stacked vertically to form uniform outer edges, the interconnect extending in continuous contact with at least one outer edge.

7. The apparatus of claim 6, in which the interconnect continuously extends around a corner defined by a junction of two uniform outer edges of the first die layer.

8. The apparatus of claim 1, in which the interconnect comprises linear exterior surfaces from the board to the second die layers.

9. An apparatus comprising:
a die package comprising a board, first die layer, and second die layer positioned in a vertically aligned stack with at least one common edge surface, the board and first and second die layers each separated by a dielectric layer and having a common width and length, the first die layer disposed between the board and second die layer; and
a first interconnect continuously extending from the second die layer to the board with a non-circular cross-section shape; and
a second interconnect continuously extending from the first die layer to the board with a non-circular cross-section shape, the first interconnect positioned between the first die layer and the second interconnect.

10. The apparatus of claim 9, in which the first and second interconnects are physically separate and overlap.

11. The apparatus of claim 10, in which the first and second interconnects are separated by a dielectric material.

12. The apparatus of claim 10, in which the second interconnect extends farther from the board than the first interconnect.

13. The apparatus of claim 9, in which a third interconnect continuously extends from the board to a third die layer with a non-circular cross-section shape.

14. The apparatus of claim 9, in which the first and second interconnects are respectively positioned on different outer surfaces of the die layers.

15. The apparatus of claim 10, in which the first and second interconnects have a common length and dissimilar pathways.

16. The apparatus of claim 9, wherein the first interconnect continuously contacts an outer edge of the die package and the second interconnect separated from the outer edge of the die package by the first interconnect.

\* \* \* \* \*